(12) United States Patent
Lee et al.

(10) Patent No.: US 11,090,910 B2
(45) Date of Patent: Aug. 17, 2021

(54) METAL PATTERN FILM AND MANUFACTURING METHOD THEREFOR

(71) Applicant: LG CHEM, LTD., Seoul (KR)

(72) Inventors: Kiseok Lee, Daejeon (KR); Song Ho Jang, Daejeon (KR); Jiehyun Seong, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/619,763

(22) PCT Filed: Mar. 27, 2018

(86) PCT No.: PCT/KR2018/003607
§ 371 (c)(1),
(2) Date: Dec. 5, 2019

(87) PCT Pub. No.: WO2018/225938
PCT Pub. Date: Dec. 13, 2018

(65) Prior Publication Data
US 2020/0101700 A1    Apr. 2, 2020

(30) Foreign Application Priority Data

Jun. 9, 2017   (KR) ................... 10-2017-0072675

(51) Int. Cl.
| B32B 3/00 | (2006.01) |
| B32B 17/10 | (2006.01) |
| B32B 7/12 | (2006.01) |
| C09J 129/04 | (2006.01) |
| C09J 167/02 | (2006.01) |

(Continued)

(52) U.S. Cl.
CPC .......... *B32B 17/10183* (2013.01); *B32B 7/12* (2013.01); *B32B 17/10018* (2013.01);
(Continued)

(58) Field of Classification Search
None
See application file for complete search history.

(56) References Cited

U.S. PATENT DOCUMENTS

| 9,128,663 B1 * | 9/2015 | Lai ........................... G06F 1/16 |
| 2006/0110590 A1 | 5/2006 | Phillips |

(Continued)

FOREIGN PATENT DOCUMENTS

| CN | 102282288 A | 12/2011 |
| EP | 3076751 A1 | 10/2016 |

(Continued)

*Primary Examiner* — Seth Dumbris
(74) *Attorney, Agent, or Firm* — Dentons US LLP

(57) ABSTRACT

A metal pattern film including a substrate; a first adhesion promoting layer provided on a first surface of the substrate; a second adhesion promoting layer provided on a second surface of the substrate, which is opposite to the first surface of the substrate; a metal pattern provided on a surface of the first adhesion promoting layer opposite to a surface of the first adhesion promoting layer adjoining the substrate; a first adhesive layer provided on a surface of the metal pattern opposite to the first adhesion promoting layer so as to cover the metal pattern; and a second adhesive layer provided on a surface of the second adhesion promoting layer opposite to a surface of the second adhesion promoting layer adjoining the substrate. Each of the first adhesion promoting layer and the second adhesion promoting layer includes an inorganic oxide. A method for preparing a metal pattern film.

13 Claims, 3 Drawing Sheets

(51) Int. Cl.
  *C23C 14/08* (2006.01)
  *C23C 14/30* (2006.01)
  *C23C 14/34* (2006.01)
  *C23F 1/02* (2006.01)

(52) U.S. Cl.
  CPC .... B32B 17/1022 (2013.01); B32B 17/10779 (2013.01); C09J 129/04 (2013.01); C09J 167/02 (2013.01); C23C 14/08 (2013.01); C23C 14/30 (2013.01); C23C 14/34 (2013.01); C23F 1/02 (2013.01); *Y10T 428/24917* (2015.01)

(56) References Cited

U.S. PATENT DOCUMENTS

| | | |
|---|---|---|
| 2011/0273356 A1 | 11/2011 | Kawaguchi et al. |
| 2012/0127578 A1* | 5/2012 | Bright .............. G02B 1/116 359/585 |
| 2015/0202846 A1 | 7/2015 | Byker et al. |
| 2017/0223779 A1 | 8/2017 | Suetsugu et al. |

FOREIGN PATENT DOCUMENTS

| | | |
|---|---|---|
| JP | 2008519102 A | 6/2008 |
| JP | 2008260227 A | 10/2008 |
| JP | 2012126578 A | 7/2012 |
| JP | 5120661 B2 | 1/2013 |
| JP | 2016020145 A | 2/2016 |
| JP | 2016044096 A | 4/2016 |
| JP | 2016102055 A | 6/2016 |
| JP | 2016120894 A | 7/2016 |
| KR | 10-2012-0012568 A | 2/2012 |
| KR | 10-20140147719 A | 12/2014 |
| KR | 101549987 B1 | 9/2015 |
| KR | 10-2015-0116767 A | 10/2015 |
| KR | 10-1718780 B1 | 3/2017 |

* cited by examiner

[FIG. 1]
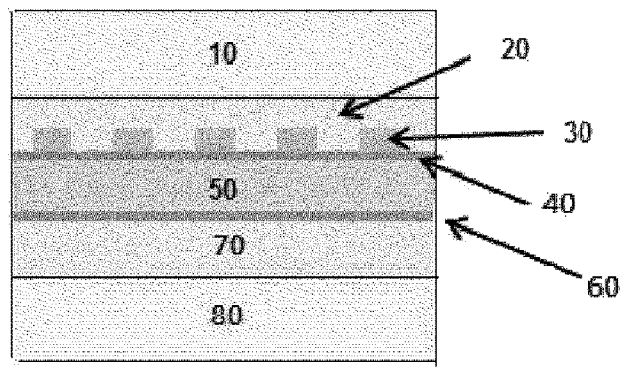
[FIG. 2]
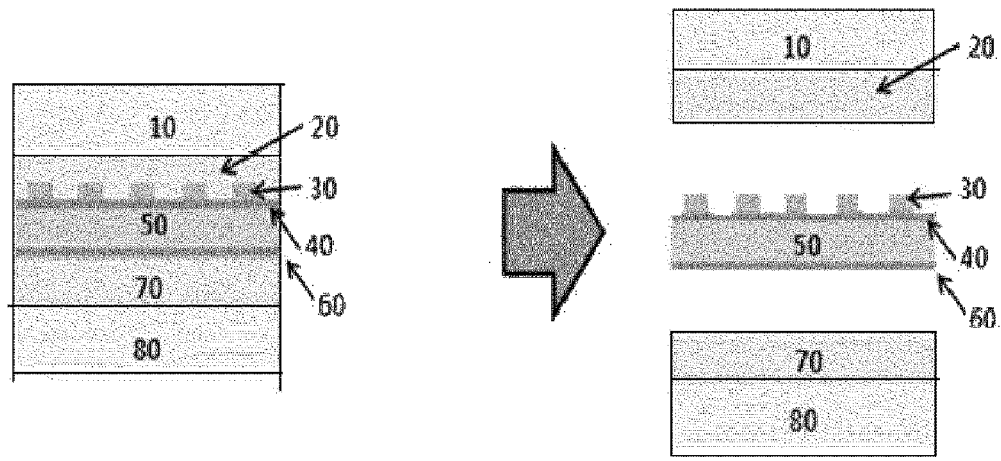

[FIG. 3]
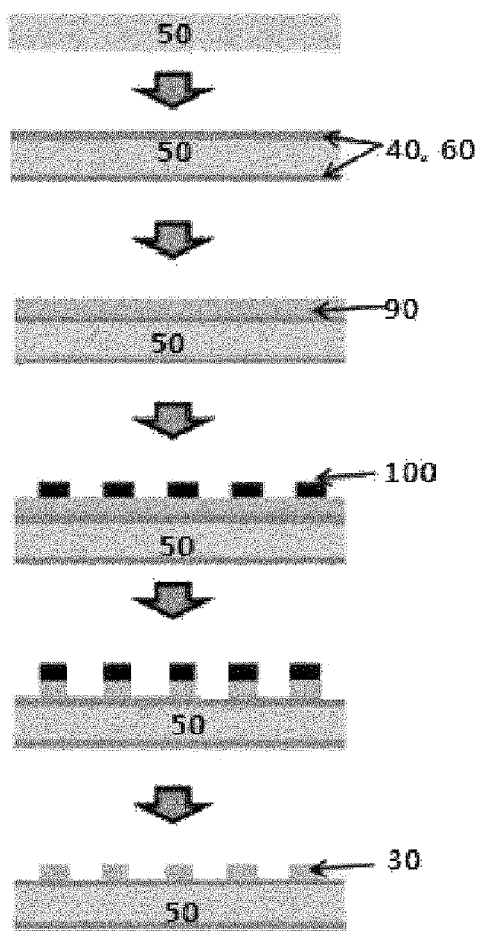

[FIG. 4]
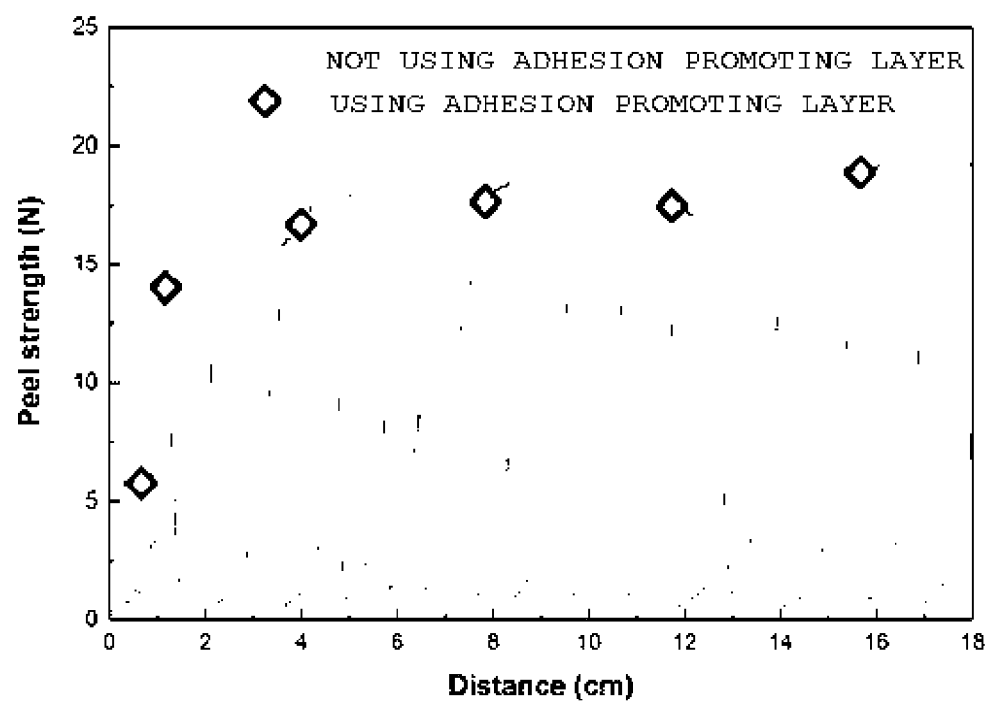

METAL PATTERN FILM AND MANUFACTURING METHOD THEREFOR

CROSS-REFERENCE TO RELATED APPLICATIONS

This application is a national stage of International Application No. PCT/KR2018/003607 filed Mar. 27, 2018, and claims priority to and the benefits of Korean Patent Application No. 10-2017-0072675, filed with the Korean Intellectual Property Office on Jun. 9, 2017, the entire contents of which are incorporated herein by reference.

TECHNICAL FIELD

The present application provides a metal pattern film comprising an adhesion promoting layer and a method for preparing the same.

BACKGROUND

When manufacturing functional laminated glass used for automobiles or construction, polyvinyl butyral (PVB) is generally used as an adhesive. Laminated glass provided with special function is manufactured using a thermocompression process by inserting a polyvinyl butyral (PVB)-laminated functional film between two sheets of glass.

In order to manufacture film-inserted functional laminated glass, adhesive strength between the polyvinyl butyral (PVB) and the functional film needs to be at a certain level or higher, and peel-off needs to be possible in order to allow reprocessing.

When peeling off an existing polyvinyl butyral (PVB)-laminated polyvinyl butyral (PVB)/functional film, a stick-slip phenomenon occurs, which leads to a disadvantage such that wrinkles and stains remain making reuse impossible.

A PET film is used as a functional film generally used in the art, and the PET film goes through a stick-slip phenomenon in the peel-off accompanying vibrations when peeling off between surfaces, and reuse is impossible since wrinkles and stains remain. Accordingly, in manufacturing functional laminated glass, a metal pattern film resolving a stick-slip phenomenon and thereby making reprocessing possible with no wrinkles and stains remaining.

SUMMARY

The present application is directed to providing a metal pattern film enhancing adhesive strength with an adhesive layer and resolving a stick-slip phenomenon when peeled off by forming an ultra-thin adhesion promoting layer on a surface of a substrate.

One embodiment of the present application provides a metal pattern film comprising a substrate; a first adhesion promoting layer and a second adhesion promoting layer each provided on both surfaces of the substrate; a metal pattern provided on a surface opposite to the surface adjoining the substrate of the first adhesion promoting layer; a first adhesive layer provided on the surface provided with the metal pattern of the first adhesion promoting layer so as to cover the metal pattern; and a second adhesive layer provided on a surface opposite to the surface adjoining the substrate of the second adhesion promoting layer, wherein the first adhesion promoting layer and the second adhesion promoting layer comprise an inorganic oxide.

Another embodiment of the present application provides laminated glass comprising the metal pattern film according to one embodiment of the present application.

Still another embodiment of the present application provides a method for preparing a metal pattern film comprising preparing a substrate; forming a first adhesion promoting layer and a second adhesion promoting layer each on both surfaces of the substrate; forming a metal pattern on a surface opposite to the surface adjoining the substrate of the first adhesion promoting layer by patterning the metal pattern; forming a first adhesive layer on the surface provided with the metal pattern of the first adhesion promoting layer so as to cover the metal pattern; and forming a second adhesive layer on a surface opposite to the surface adjoining the substrate of the second adhesion promoting layer, wherein the first adhesion promoting layer and the second adhesion promoting layer comprise an inorganic oxide.

A metal pattern film according to one embodiment of the present application forms an ultra-thin inorganic oxide layer on both surfaces of a substrate to enhance adhesive strength with an adhesive layer without decreasing transmittance, and by resolving a stick-slip phenomenon when peeled off, wrinkles and stain formation are prevented by reducing vibrations when peeling off between surfaces, which makes reprocessing possible.

In addition, by forming an ultra-thin inorganic oxide layer, the metal pattern film according to one embodiment of the present application is effective in enhancing adhesiveness between a substrate and a pattern layer deposited on the substrate, and may comprise a function of an adhesion layer of a fabric of a metal mesh-based transparent conductive film.

Furthermore, by using a nanoscale inorganic oxide layer, the metal pattern film according to one embodiment of the present application is transparent and has no changes in the optical properties of the film, and is thereby useful when manufacturing transparent functional laminated glass.

BRIEF DESCRIPTION OF DRAWINGS

FIG. 1 is a side view illustrating a metal pattern film according to one embodiment of the present application.

FIG. 2 is a diagram illustrating a peel-off process according to one embodiment of the present application.

FIG. 3 is a diagram illustrating a method for preparing a metal pattern according to one embodiment of the present application.

FIG. 4 is a diagram measuring peel strength of a metal pattern film according to one embodiment of the present application.

REFERENCE NUMERALS

10: Glass
20: First Adhesive Layer
30: Metal Pattern
40: First Adhesion Promoting Layer
50: Substrate
60: Second Adhesion Promoting Layer
70: Second Adhesive Layer
80: Glass
90: Metal Layer
100: Etching Resist Pattern

DETAILED DESCRIPTION

Hereinafter, the present specification will be described in more detail.

Embodiments of the present disclosure will be described in detail with reference to accompanying drawings so that those skilled in the art may readily implement the present disclosure.

However, the present disclosure may be embodied in various different forms, and is not limited to the embodiments described herein.

A metal pattern film according to one embodiment of the present application comprises a substrate; a first adhesion promoting layer and a second adhesion promoting layer each provided on both surfaces of the substrate; a metal pattern provided on a surface opposite to the surface adjoining the substrate of the first adhesion promoting layer; a first adhesive layer provided on the surface provided with the metal pattern of the first adhesion promoting layer so as to cover the metal pattern; and a second adhesive layer provided on a surface opposite to the surface adjoining the substrate of the second adhesion promoting layer, wherein the first adhesion promoting layer and the second adhesion promoting layer comprise an inorganic oxide.

The metal pattern film according to one embodiment of the present application forms an ultra-thin inorganic oxide layer on both surfaces of a substrate to enhance adhesive strength with an adhesive layer without decreasing transmittance, and by resolving a stick-slip phenomenon when peeled off, wrinkles and stain formation are prevented by reducing vibrations when peeling off between surfaces, which makes reprocessing possible, and in addition thereto, is effective in enhancing adhesiveness between a pattern and the substrate by forming a nanoscale inorganic oxide layer.

In the present specification, the stick-slip phenomenon means a friction phenomenon accompanying vibrations when peeling off between surfaces or a phenomenon decreasing precision through generating vibrations by causing a motion that is not smooth.

In one embodiment of the present application, the substrate may be formed with a transparent polymer film.

In one embodiment of the present application, the substrate may be formed with a PET film, a polycarbonate (PC) film, a polyethylene naphthalate (PEN) film, but is not limited thereto.

In one embodiment of the present application, the substrate may have a thickness of greater than or equal to 1 μm and less than or equal to 200 μm, and preferably greater than or equal to 10 μm and less than or equal to 100 μm.

In one embodiment of the present application, the first and the second adhesion promoting layers comprise one or more selected from the group consisting of niobium oxide ($Nb_2Ox$), aluminum oxide ($Al_2O_3$), silicon oxide ($SiO_2$), zinc oxide (ZnO), niobium oxide (NbO), tin oxide (SnO), zirconium oxide (ZrO) and indium tin oxide (ITO).

In the niobium oxide ($Nb_2Ox$), the range of x is an integer of 1 to 6, and preferably an integer of 1 to 4.

In one embodiment of the present application, the first and the second adhesion promoting layers may be formed with aluminum oxide ($Al_2O_3$).

In another embodiment, the first and the second adhesion promoting layers may be formed with silicon oxide ($SiO_2$).

In another embodiment, the first and the second adhesion promoting layers may be formed with indium tin oxide (ITO).

In another embodiment, the $Nb_2Ox$ layer may be used alone as the first and the second adhesion promoting layers.

When the $Nb_2Ox$ layer is used alone as the first and the second adhesion promoting layers, optical properties of the metal pattern film are most superior.

In another embodiment, an alloy interlayer may be further included between the first adhesion promoting layer and the surface adjoining the substrate thereof.

In another embodiment, an alloy interlayer may be further included between the second adhesion promoting layer and the surface adjoining the substrate thereof.

In one embodiment of the present application, the alloy interlayer may have a thickness of greater than or equal to 0.5 nm and less than or equal to 1.9 nm, and preferably greater than or equal to 0.5 nm and less than or equal to 1.5 nm.

The alloy interlayer having a thickness of 2 nm or greater leads to performance decline due to a decrease in the visible light transmittance.

The alloy interlayer may be NiCr, Ni or Cr, but is not limited thereto.

In the metal pattern film, when using an inorganic oxide layer as the first and the second adhesion promoting layers, a stick-slip phenomenon significantly decreases as a result of peel-off evaluation after thermocompressing the substrate (PET) and polyvinyl butyral (PVB), and as a result, wrinkles and stains do not remain making metal pattern film reprocessing possible.

In one embodiment of the present application, the first and the second adhesion promoting layers each have a thickness of greater than or equal to 0.1 nm and less than or equal to 30 nm, preferably greater than or equal to 1 nm and less than or equal to 25 nm, and more preferably greater than or equal to 1 nm and less than or equal to 20 nm.

Forming the adhesion promoting layer having a nanoscale thickness is useful in manufacturing transparent functional laminated glass since there are no changes in the optical properties of the film, and without decreasing transmittance, a stick-slip phenomenon may be resolved when peeled off as well as enhancing adhesive strength with an adhesive layer.

The metal pattern film according to one embodiment of the present application has a metal pattern provided on a surface opposite to the surface adjoining the substrate of the first adhesion promoting layer.

In one embodiment of the present application, the metal pattern may comprise one or more selected from the group consisting of aluminum, copper, nickel, chromium, gold, silver and platinum, and although copper having excellent electrical conductivity is most preferred as the metal pattern, the metal pattern is not limited thereto.

In one embodiment of the present application, the metal pattern may have a line height of 10 μm or less and preferably 5 μm or less.

The line height of the metal pattern means a distance from the surface adjoining the adhesion promoting layer to a surface opposite thereto.

In one embodiment of the present application, the metal pattern may have a line height deviation of 20% or less and preferably 5% or less.

The deviation means, based on an average line height, a percentage on a difference between the average line height and an individual line height.

In one embodiment of the present application, the metal pattern may have a total aperture ratio, that is, a ratio of the substrate area that is not covered by the metal pattern, of 90% or greater, and preferably 95% or greater.

In one embodiment of the present application, the metal pattern may have a line width of 40 μm or less, and specifically 0.1 μm to 40 μm or less.

In one embodiment of the present application, the metal pattern has line-to-line spacing of 50 μm to 1000 μm.

In one embodiment of the present application, the first and the second adhesive layers may comprise polyvinyl butyral (PVB), ethylene vinyl acetate (EVA), polyurethane (PU) or polyolefin (PO), and may preferably be a polyvinyl butyral (PVB) layer.

In another embodiment, the first and the second adhesive layers may each have a thickness of greater than or equal to 1 µm and less than or equal to 1000 µm, and preferably greater than or equal to 1 µm and less than or equal to 760 µm.

When each of the first and the second adhesive layers has the above-mentioned thickness, adhesiveness of the metal pattern film is enhanced, and particularly when further including laminated glass, an effect of preventing scattering of debris when the glass breaks down is obtained.

One embodiment of the present application provides laminated glass comprising the metal pattern film.

In one embodiment of the present application, the laminated glass is formed with a constitution further comprising glass on each of a surface opposite to the surface adjoining the pattern-formed first adhesion promoting layer of the first adhesive layer and a surface opposite to the surface adjoining the second adhesion promoting layer of the second adhesive layer.

The laminated glass may be manufactured through thermocompressing the temporarily laminated adhesive layer of the metal pattern film and the glass.

In one embodiment of the present application, as for the lamination of the first and the second adhesive layers and the glass, the temporarily laminated adhesive layer is inserted between tempered glass to manufacture into a sheet unit at a temperature of 140° C. or higher using a thermocompression equipment such as a vacuum laminator or autoclave.

According to one embodiment of the present application, a primer layer may be further provided at an interface of the metal pattern and the substrate.

One embodiment of the present application provides a method for preparing a metal pattern film comprising preparing a substrate; forming a first adhesion promoting layer and a second adhesion promoting layer each on both surfaces of the substrate; forming a metal pattern on a surface opposite to the surface adjoining the substrate of the first adhesion promoting layer by patterning the metal pattern; forming a first adhesive layer on the surface provided with the metal pattern of the first adhesion promoting layer so as to cover the metal pattern; and forming a second adhesive layer on a surface opposite to the surface adjoining the substrate of the second adhesion promoting layer, wherein the first adhesion promoting layer and the second adhesion promoting layer comprise an inorganic oxide.

In the preparation method according to one embodiment of the present application, the first and the second adhesion promoting layers may be formed on the substrate by a vapor deposition process using e-beam sputter equipment, however, the method is not limited thereto.

In the preparation method according to one embodiment of the present application, the forming of first and second adhesive layers on each of the first adhesion promoting layer and the second adhesion promoting layer may use a process of thermocompression, solid-state adhesive film lamination or liquid-state adhesive solution coating, and preferably, a thermocompression process may be used.

Pressure, temperature and time of the thermocompression process vary depending on the type of the adhesive layer used, however, the thermocompression process may be carried out at a temperature selected from a range of, for example, 60° C. to 150° C., and a pressure may be applied as necessary.

In one embodiment of the present application, the temporary lamination of the first and the second adhesive layers on both surfaces of the adhesion promoting layer may use a roll laminator at a temperature of approximately 80° C.

In the preparation method according to one embodiment of the present application, the forming of a metal pattern comprises forming a metal layer; and forming a metal pattern by patterning the metal layer in the provided method for preparing a metal pattern film.

In the preparation method according to one embodiment of the present application, the forming of a metal layer may be carried out through deposition or plating.

In the preparation method according to one embodiment of the present application, the forming of a metal pattern by patterning the metal layer is carried out by, after forming an etching resist pattern on the metal layer, removing the metal layer that is not covered by the etching resist pattern in the provided method for preparing a metal pattern film.

The forming of an etching resist pattern on the metal layer may use a photo process or a printing process, but is not limited thereto.

After forming a metal pattern by selectively etching the etching resist pattern-formed metal layer in the preparation method according to one embodiment of the present application, removing the etching resist remaining on the top of the metal pattern using a peeling liquid may be further included.

As the peeling liquid for removing the etching resist, an alkali solution or an organic solvent may be used.

As the alkali solution, an aqueous sodium hydroxide solution diluted to a concentration of 1.0 wt % or greater, or potassium hydroxide may be used, and the alkali solution is not limited thereto as long as it is an alkali solution.

As the organic solvent, ethanol, isopropyl alcohol or acetone may be used, and the organic solvent is not limited thereto as long as it is an organic solvent.

FIG. 3 is a diagram illustrating a process of forming a metal pattern on the adhesion promoting layer-formed substrate.

Specifically, it is a diagram illustrating a process of forming a metal pattern by, after forming first and second adhesion promoting layers on a substrate and then forming a metal layer on the first adhesion promoting layer, forming an etching resist pattern and then selectively etching the result.

In the preparation method according to one embodiment of the present application, a method for preparing a metal pattern film further comprising a process of peeling the first adhesive layer from the metal pattern-provided substrate is provided.

FIG. 2 illustrates a peel-off process of the metal pattern film according to the present disclosure. Specifically, it is a process of peeling the first and the second adhesive layers from the metal pattern-provided substrate, and illustrates a process of peeling off the adhesive layer and the pattern film using physical force.

When laminating the first adhesive layer on the substrate, defects such as bubble generation, alien substance introduction or substrate wrinkling may occur, and the peel-off process may be progressed in order to reuse the first adhesive layer or the metal pattern-provided substrate, and herein, by using the first and the second adhesion promoting layers, advantages of resources recycling and production cost reduction are obtained by preventing a stick-slip phenomenon and thereby preventing damages on the first adhesive layer and the metal pattern substrate.

By using the adhesion promoting layer according to one embodiment of the present application in the process of peeling off the first adhesive layer and the metal pattern-provided substrate, a metal pattern film with a significantly reduced stick-slip phenomenon may be prepared.

FIG. 1 illustrates a lamination structure of the metal pattern film. A method of forming a conductive heating pattern on a substrate and forming an adhesive layer has been used in the art, however, according to the present disclosure, a stick-slip phenomenon may be significantly reduced by further comprising an adhesion promoting layer on a substrate.

Hereinafter, examples of the present disclosure will be described in detail so that those skilled in the art may readily implement the present disclosure. However, the present disclosure may be embodied in various different forms, and is not limited to the examples described herein.

Examples and comparative examples of a metal pattern film according to one embodiment of the present disclosure are described in the following Table 1.

Example 1

On polyethylene terephthalate (PET) having a thickness of 50 μm, 16 nm ITO was deposited on the PET as an adhesion promoting layer through a vapor deposition process using e-beam sputter equipment. After that, a Cu layer was formed on the ITO layer through plating, and then an etching resist pattern was formed through a printing process. After forming a metal pattern by selectively etching the etching resist pattern-formed metal layer, the etching resist remaining on the top of the metal pattern was removed using an aqueous sodium hydroxide solution with a concentration of 1.0 wt %. After that, PVB was laminated as an adhesive layer for 30 minutes under vacuum at 140° C. to prepare a metal pattern film.

Examples 2 to 4

Metal pattern films of Examples 2 to 4 were prepared in the same manner as in Example 1 except that materials of the following Table 1 were each used as the adhesion promoting layer.

Comparative Examples 1 to 13

Metal pattern films of Comparative Examples 1 to 13 were prepared in the same manner as in Example 1 except that PET films supplied from film manufacturers described in the following Table 1 were each used instead of polyethylene terephthalate (PET), and the adhesion promoting layer was not used. The substrates of the following Table 1 are grade names of PET films supplied from various film manufacturers.

TABLE 1

| | PET Manufacturer (Grade Name) | Adhesion Promoting Layer | Thickness (μm) | Avg. 90 Peel Strength (N/cm) | Max. 90 Peel Strength (N/cm) | Stick/Slip |
|---|---|---|---|---|---|---|
| Example 1 | Toray (XG7PH2) | ITO (16) | 50 | 15.30 | >20 | X |
| Example 2 | Toray (XG7PH2) | SiO$_2$ (12) | 50 | >20 | >20 | X |
| Example 3 | Toray (XG7PH2) | Al$_2$O$_3$ (8) | 50 | 17.95 | >20 | X |
| Example 4 | Toray (XG7PH2) | NbOx (5) | 50 | >20 | >20 | X |
| Comparative Example 1 | SKC (TH34) | X | 20 | 2.45 | 7.1 | ○ |
| Comparative Example 2 | Teijin DuPont (KEL86W) | X | 50 | 0.80 | 2.87 | ○ |
| Comparative Example 3 | Teijin DuPont (HPE) | X | 38 | 0.25 | 0.53 | ○ |
| Comparative Example 4 | Teijin DuPont (G2P2) | X | 38 | 0.16 | 0.25 | ○ |
| Comparative Example 5 | Teijin DuPont (G2PZ) | X | 38 | 1.30 | 5.36 | ○ |
| Comparative Example 6 | Mitsubishi (O300E188W53B2) | X | 188 | 0.95 | 11.8 | ○ |
| Comparative Example 7 | Mitsubishi (T604E50E92) | X | 50 | 0.58 | 3.6 | ○ |
| Comparative Example 8 | Mitsubishi (1604E50M12) | X | 50 | 2.30 | 6.8 | ○ |
| Comparative Example 9 | Toray (XD592) | X | 75 | 3.79 | 18.0 | ○ |
| Comparative Example 10 | Toray (U48) | X | 50 | 2.62 | 13.0 | ○ |
| Comparative Example 11 | Toray (XG7PH2) | X | 50 | 4.15 | 15.41 | ○ |
| Comparative Example 12 | LGC Primer Coating PET (Front Surface) | X | 50 | 4.07 | 15.04 | ○ |

TABLE 1-continued

| | PET Manufacturer (Grade Name) | Adhesion Promoting Layer | Thickness (μm) | Avg. 90 Peel Strength (N/cm) | Max. 90 Peel Strength (N/cm) | Stick/Slip |
|---|---|---|---|---|---|---|
| Comparative Example 13 | LGC Primer Coating PET (Rear Surface) | X | 50 | 1.90 | 5.27 | ○ |

In Table 1, it was identified that, depending on the presence of the adhesion promoting layer according to the present disclosure, Examples 1 to 4 thermocompressing inorganic oxide-deposited PET and PVB had no stick/slip phenomenon compared to Comparative Examples 1 to 13 without inorganic oxide layer deposition based on the peel-off evaluation results.

The occurring of stick/slip phenomenon is determined from visual observation and the shape of a peel strength-measuring graph.

In the method for measuring peel strength between the substrates in Table 1, average force according to a 90 degree peel strength test, a method measuring force for peeling off at a constant rate while maintaining an adhered surface and a peeled surface to be vertical, was expressed as Avg. 90 peel strength (N/cm), and the maximum value was expressed as Max. 90 peel strength (N/cm). The measurement values of the peel strength test are data capable of identifying adhesiveness between the substrate and the first adhesive layer and an effect of preventing a stick/slip phenomenon, and a texture analyzer (TA XT Plus) was used as a measuring device.

In Table 1, it was identified that, in Examples 1 to 4, average force and maximum values for peeling off the first adhesive layer from the metal pattern-provided substrate all increased compared to Comparative Examples 1 to 13 without inorganic oxide layer deposition.

Through such values, it was identified that, by using the adhesion promoting layer of the present disclosure, adhesiveness between the first adhesive layer and the substrate increased.

FIG. 4 is a graph measuring peel strength of the metal pattern film according to one embodiment of the present application. Specifically, ITO was used as the adhesion promoting layer as in Example 1, and FIG. 4 is a graph measuring peel strength obtained therefrom. It was identified that the graph shape was more gradual compared to when the adhesion promoting layer was not used, which indicates no occurrences of stick/slip phenomenon, and it was identified that, through the strength of peel strength, adhesiveness also increased.

From the following Table 2, damages on the metal pattern film when using various types of acids on the metal pattern film of the present disclosure may be identified when using NbOx (5 nm)/PET (100 μm) as the adhesion promoting layer and the adhesive layer of the metal pattern film. As seen from the following Table 2, it was identified that various types of acids caused no damages on the NbOx layer and a stick/slip phenomenon still did not occur.

TABLE 2

| | Avg. 90 Peel Strength (N/cm) | Max. 90 Peel Strength (N/cm) | Stick/Slip |
|---|---|---|---|
| Chemical Treatment X | >20 | >20 | X |
| Blending acid of phosphoric acid, Nitric acid and Acetic acid | >20 | >20 | X |
| Sulfuric Acid | >20 | >20 | X |
| Hydrogen Peroxide | | | |
| Iron Chloride | >20 | >20 | X |
| Client Company PET | 6.12 | 7.13 | X |

In the following Table 3, it was identified that, although adhesive strength between a metal layer and a substrate is generally maintained by forming 20 nm or more of NiCr at the bottom of the metal layer since adhesive strength between metal layer-substrate decreases when electroplating on a metal seed film formed without an adhesion promoting layer due to an increase in the cohesiveness of the metal layer, adhesive strength between metal layer-substrate increased after plating when introducing an adhesion promoting layer such as NbOx, and particularly, optical properties were most superior when using $Nb_2Ox$ alone.

A cross-cut test was used as a method of simply measuring adhesiveness between the substrate and the thin film formed on the substrate. This is a method of evaluating adhesiveness between substrates by forming 100 cells through making cuts 10 times vertically and horizontally at 1 mm intervals, and checking how much remains on the substrate when attaching and removing an adhesive tape (generally using ichiban tape) on the thin film.

95% to 100% of the thin film remaining based on the measurement is expressed as 5 B, and as the degree of maintaining the thin film on the substrate decreases, the expressed number decreases (4 B to 0 B), and this means adhesiveness decreasing. In the following Table 3, it was described as OK (5 B) for the results checked as approximately 5 B in the cross-cut test between the plated metal layer and the substrate.

As seen from the following Table 3, it was identified that adhesive strength between metal layer-film was not favorable (NG) after plating when an interlayer was not used, and adhesive strength between film-PVB was not favorable (NG) as well after removing the plating layer. It was identified that adhesive strength was improved when using an inorganic oxide interlayer, an alloy interlayer and an alloy+inorganic oxide interlayer.

In the following Table 3, sheet resistance was measured using a contact-type sheet resistance measuring device (4-point probe), and transmittance was measured using a COH-400 transmittance measuring device (D65/10).

TABLE 3

| | Category | Interlayer Use X | Inorganic Oxide Interlayer | Alloy Interlayer | Alloy + Inorganic Oxide Interlayer |
|---|---|---|---|---|---|
| | Metal Deposited Film Structure | PET/Cu | PET/Nb$_2$Ox/Cu | PET/NiCr/Cu | PET/NiCr/Nb$_2$Ox/Cu |
| Before Plating | Sheet Resistance ($\Omega/\square$) | 0.2 | 0.2 | 0.2 | 0.2 |
| | Adhesive Strength between Metal Layer-Film | OK (5B) | OK (5B) | OK (5B) | OK (5B) |
| After Plating | Sheet Resistance ($\Omega/\square$) | 0.01 | 0.01 | 0.01 | 0.01 |
| | Adhesive Strength between Metal Layer-Film | NG | OK (5B) | OK (5B) | OK (5B) |
| After Removing | Transmittance (%) | 90.01 | 88.37 | 86.82 | 83.75 |
| | Scattering Degree (%) | 1.09 | 1.55 | 1.12 | 1.21 |
| Plating Layer | Film-PVB Adhesive Strength (90 Degree Peel Test) | NG (~4 N/cm) | OK (>20 N/cm) | OK (~15 N/cm) | OK (>20 N/cm) |

The invention claimed is:

1. A metal pattern film comprising:
   a substrate;
   a first adhesion promoting layer provided on an entirety of a first surface of the substrate;
   a second adhesion promoting layer provided on an entirety of a second surface of the substrate which is opposite to the first surface of the substrate;
   a metal pattern provided on a surface of the first adhesion promoting layer opposite to the surface of the first adhesion promoting layer adjoining the substrate;
   a first adhesive layer provided on a surface of the metal pattern opposite to the first adhesion promoting layer, wherein the first adhesive layer covers the metal pattern; and
   a second adhesive layer provided on a surface of the second adhesion layer opposite to the surface of the second adhesion layer adjoining the substrate,
   wherein each of the first adhesion promoting layer and the second adhesion promoting layer comprises an inorganic oxide,
   wherein each of the first and second adhesion promoting layers has a thickness of greater than or equal to 0.1 nm and less than or equal to 20 nm.

2. The metal pattern film of claim 1, wherein each of the first and second adhesion promoting layers comprises one or more selected from the group consisting of niobium oxide, aluminum oxide, silicon oxide, zinc oxide, tin oxide, zirconium oxide and indium tin oxide.

3. The metal pattern film of claim 1, wherein the metal pattern comprises one or more selected from the group consisting of aluminum, copper, nickel, chromium, gold, silver and platinum.

4. The metal pattern film of claim 1, wherein the metal pattern has a line height of 10 μm or less.

5. The metal pattern film of claim 1, wherein the metal pattern has a line height deviation of 20% or less.

6. The metal pattern film of claim 1, wherein each of the first and second adhesive layers comprises polyvinyl butyral (PVB), ethylene vinyl acetate (EVA), polyurethane (PU) or polyolefin (PO).

7. The metal pattern film of claim 1, wherein each of the first and second adhesive layers is a polyvinyl butyral (PVB) layer.

8. The metal pattern film of claim 1, wherein each of the first and second adhesive layers has a thickness of greater than or equal to 1 μm and less than or equal to 1000 μm.

9. Laminated glass comprising the metal pattern film of claim 1.

10. A method for preparing the metal pattern film of claim 1, the method comprising:
    preparing a substrate;
    forming a first adhesion promoting layer on an entirety of a first surface of the substrate;
    forming a second adhesion promoting layer on an entirety of a second surface of the substrate, which is opposite to the first surface of the substrate;
    forming a metal pattern on a surface of the first adhesion promoting layer opposite to a surface of the first adhesion promoting layer adjoining the substrate;
    forming a first adhesive layer on a surface of the metal pattern opposite to the first adhesion promoting layer so as to cover the metal pattern; and
    forming a second adhesive layer on a surface of the second adhesion promoting layer opposite to a surface of the second adhesion promoting layer adjoining the substrate,
    wherein each of the first adhesion promoting layer and the second adhesion promoting layer comprises an inorganic oxide, wherein each of the first and second adhesion promoting layers has a thickness of greater than or equal to 0.1 nm and less than or equal to 20 nm.

11. The method for preparing the metal pattern film of claim 10, wherein the forming of a metal pattern comprises forming a metal layer; and patterning the metal layer.

12. The method for preparing the metal pattern film of claim 11, wherein patterning the metal layer comprises forming an etching resist pattern on the metal layer, and removing the metal layer that is not covered by the etching resist pattern.

13. The method for preparing the metal pattern film of claim 10, further comprising peeling off the first adhesive layer from the metal pattern film.

\* \* \* \* \*